US012563681B2

(12) United States Patent
Jang et al.

(10) Patent No.: US 12,563,681 B2
(45) Date of Patent: Feb. 24, 2026

(54) DISPLAY APPARATUS

(71) Applicant: SAMSUNG DISPLAY CO., LTD., Yongin-si (KR)

(72) Inventors: Jaesoo Jang, Yongin-si (KR); Donghyeon Kim, Yongin-si (KR); Juyeop Seong, Yongin-si (KR); Heekwon Lee, Yongin-si (KR); Jaewon Jeong, Yongin-si (KR); Sungyeon Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 205 days.

(21) Appl. No.: 18/225,629

(22) Filed: Jul. 24, 2023

(65) Prior Publication Data

US 2024/0032219 A1     Jan. 25, 2024

(30) Foreign Application Priority Data

Jul. 25, 2022     (KR) ........................ 10-2022-0092061

(51) Int. Cl.
| | |
|---|---|
| *H05K 5/02* | (2006.01) |
| *H10K 59/12* | (2023.01) |
| *H10K 102/00* | (2023.01) |

(52) U.S. Cl.
CPC ........... *H05K 5/0217* (2013.01); *H10K 59/12* (2023.02); *H10K 2102/311* (2023.02)

(58) Field of Classification Search
USPC ......................................................... 361/807
See application file for complete search history.

(56) References Cited

U.S. PATENT DOCUMENTS

| | | | |
|---|---|---|---|
| 11,058,018 B1 | 7/2021 | Yoon et al. | |
| 11,288,986 B2 | 3/2022 | Ha et al. | |
| 2020/0315036 A1* | 10/2020 | Ahn | G06F 1/1652 |
| 2021/0272486 A1 | 9/2021 | Khachatryan et al. | |
| 2022/0087040 A1* | 3/2022 | Song | G06F 1/1652 |

FOREIGN PATENT DOCUMENTS

| | | |
|---|---|---|
| CN | 110120191 A | 8/2019 |
| CN | 113053247 A | 6/2021 |
| KR | 1020160141255 A | 12/2016 |
| KR | 1020190085208 A | 7/2019 |
| KR | 1020200006645 | 1/2020 |
| KR | 1020200064376 A | 6/2020 |
| KR | 102274481 B1 | 7/2021 |

* cited by examiner

*Primary Examiner* — Hung S. Bui

(74) *Attorney, Agent, or Firm* — CANTOR COLBURN LLP

(57) ABSTRACT

A display apparatus includes a display module, a plurality of moving bars disposed on a surface opposite to a display surface of the display module, sliding portions coupled to opposing ends of the plurality of moving bars in a longitudinal direction, and side guide portions which accommodate the sliding portions and guide sliding of the sliding portions, respectively. Each of the sliding portions includes a plurality of bearings spaced apart in the longitudinal direction, and the plurality of bearings is in contact with corresponding side guide portion of the side guide portions.

11 Claims, 13 Drawing Sheets

DISPLAY APPARATUS

This application claims priority to Korean Patent Application No. 10-2022-0092061, filed on Jul. 25, 2022, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus in which a defect of a display panel is prevented.

2. Description of the Related Art

Recently, electronic devices have been widely used in various fields. Electronic devices are used in various ways, for example as mobile electronic devices and fixed electronic devices. Such electronic devices include display apparatuses to provide visual information such as images or videos to users, to support various functions.

Recently, as other parts for driving display apparatuses have been miniaturized, the proportion occupied by display apparatuses in electronic devices has gradually been increasing. Also under development is a structure that is bendable to have a certain angle from a flat state, is foldable about an axis, or is slidable to be drawn in and out.

SUMMARY

In a display apparatus configured to be slidably drawn in and out, a display module thereof may be partially bent and slid so that a first surface thereof faces a second surface thereof. In this case, the display module may be deformed at a bent portion due to tension or compression, resulting in a defect in the display module.

One or more embodiments include a display apparatus, in which a display module slides smoothly to prevent damage in a bent portion.

According to one or more embodiments, a display apparatus includes a display module, a plurality of moving bars disposed on a surface opposite to a display surface of the display module, sliding portions coupled to both ends of the plurality of moving bars in a longitudinal direction, and side guide portions which accommodate the sliding portions and guide sliding of the sliding portions, respectively, where each of the sliding portions includes a plurality of bearings spaced apart in the longitudinal direction, and the plurality of bearings is in contact with a corresponding side guide portion of the side guide portions.

In an embodiment, each of the sliding portions may further include a body portion which accommodates the plurality of bearings, and the body portion may be flexibly movable within the corresponding side guide portion of the side guide portion.

In an embodiment, a plurality of accommodation holes may be defined in each of the sliding portions, and the plurality of moving bars may be inserted in the plurality of accommodation holes, respectively.

In an embodiment, the plurality of bearings and the plurality of accommodation holes may be alternately arranged with each other in the longitudinal direction.

In an embodiment, each of the plurality of moving bars may include a first bar connected to the display module and a second bar connected to each of opposing ends of the first bar in the longitudinal direction and coupled to a corresponding one of the plurality of accommodation holes, and a cross-section of the second bar may be smaller than a cross-section of the first bar.

In an embodiment, each of the side guide portions may include first side guide portions which have a straight shape, extend in a first direction, and face each other, and a second side guide portion which has a curved shape and is between the first side guide portions.

In an embodiment, the display module may be slidable while being bent along a curvature of the second side guide portion.

In an embodiment, when viewed from the first direction, each of the side guide portions may include an open surface, a first guide surface facing the open surface, and a second guide surface and a third guide surface connected to opposing ends of the first guide surface and facing each other.

In an embodiment, the second guide surface and the third guide surface may be parallel to each other.

In an embodiment, the second guide surface and the third guide surface may be inclined to be closer to each other as being toward the open surface.

In an embodiment, each of the side guide portions may include protrusions at an end of the second guide surface adjacent to the open surface and an end of the third guide surface.

According to one or more embodiments, a display apparatus includes a display module slidable in a first direction and bendable in a way such that a portion of a surface thereof faces another portion of the surface, side guide portions which accommodate opposing ends of the display module in a second direction crossing the first direction and guide sliding of the display module, and a central guide portion in contact with a bent portion of the display module and between the side guide portions, where the central guide portion rotates about a rotational axis extending in the second direction.

In an embodiment, the display apparatus may further include a guide driver which rotates the central guide portion.

In an embodiment, the display apparatus may further include a plurality of moving bars arranged on a surface opposite to a display surface of the display module, wherein the central guide portion may include a tooth portion arranged along an outer surface thereof and engaged with the plurality of moving bars.

In an embodiment, the central guide portion may include a cylindrical member extending between the opposing ends of the display module in the second direction.

In an embodiment, the cylindrical member may include a plurality of cylindrical members spaced apart from each other in the second direction.

In an embodiment, each of the side guide portions may include first side guide portions which have a straight shape, extend in the first direction, and face each other, and a second side guide portion which has a curved shape and is between the first side guide portions.

In an embodiment, the central guide portion may include a push bar between the opposing ends of the display module in the second direction, the push bar having a same curvature as a curvature of the second side guide portion.

In an embodiment, the push bar may be bonded to a surface opposite to a display surface of the display module.

In an embodiment, the display apparatus may further include sliding portions connected to the opposing ends of the display module in the second direction and respectively accommodated in the side guide portions to be slidable within the side guide portions.

Other aspects, features, and advantages of the disclosure will become better understood through the detailed description, the claims, and the accompanying drawings.

BRIEF DESCRIPTION OF THE DRAWINGS

The above and other features of certain embodiments of the disclosure will be more apparent from the following description taken in conjunction with the accompanying drawings, in which:

FIGS. 1A and 1B are perspective views schematically illustrating a display apparatus in a slid-in state, according to an embodiment;

FIG. 6 is a perspective view schematically illustrating a side guide portion, a sliding portion, and a moving bar, according to an embodiment;

DETAILED DESCRIPTION

Figure 1A:
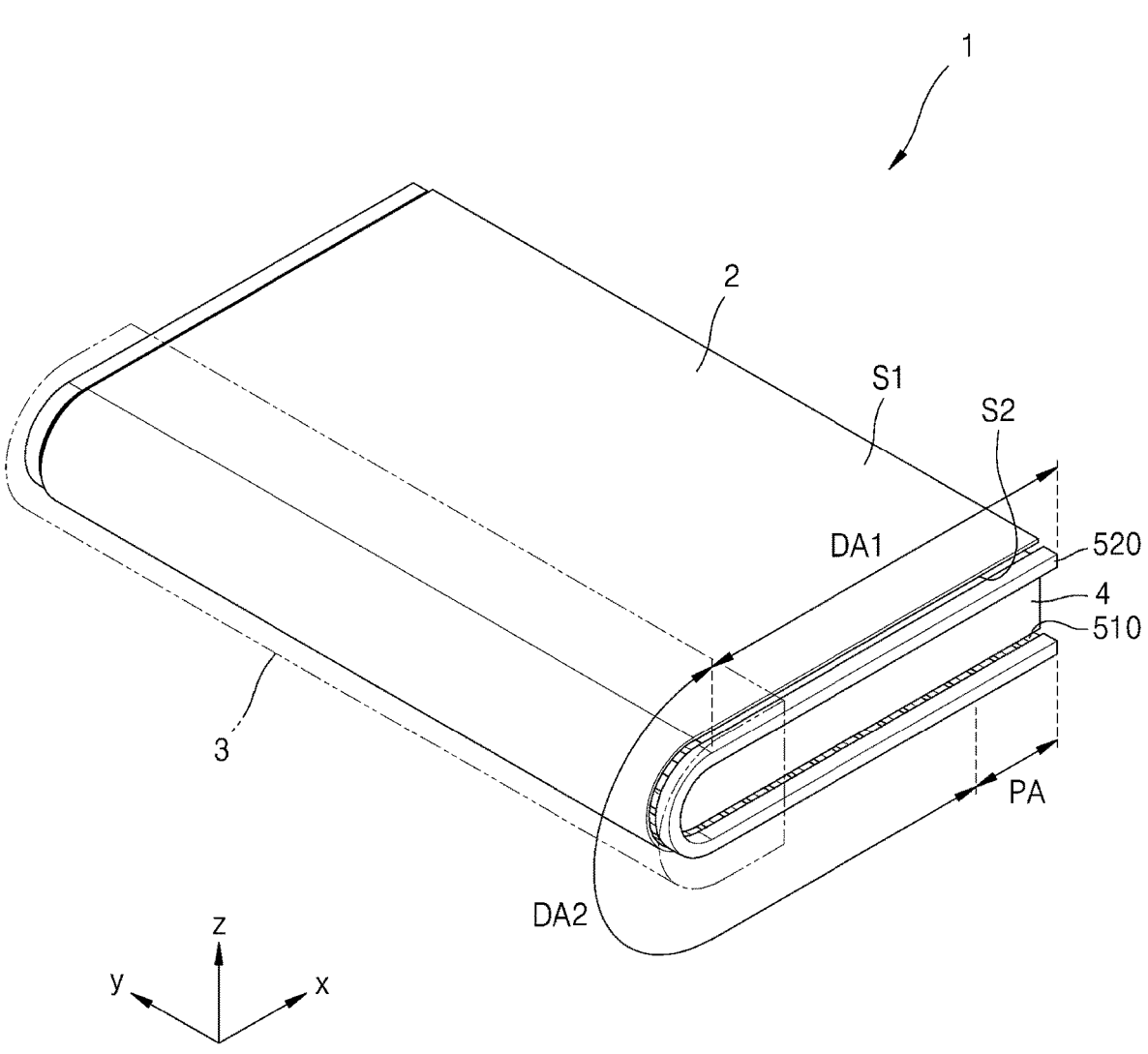

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

The X-axis, the Y-axis, and the Z-axis are not limited to three axes of the rectangular coordinate system and may be interpreted in a broader sense. For example, the X-axis, the Y-axis, and the Z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
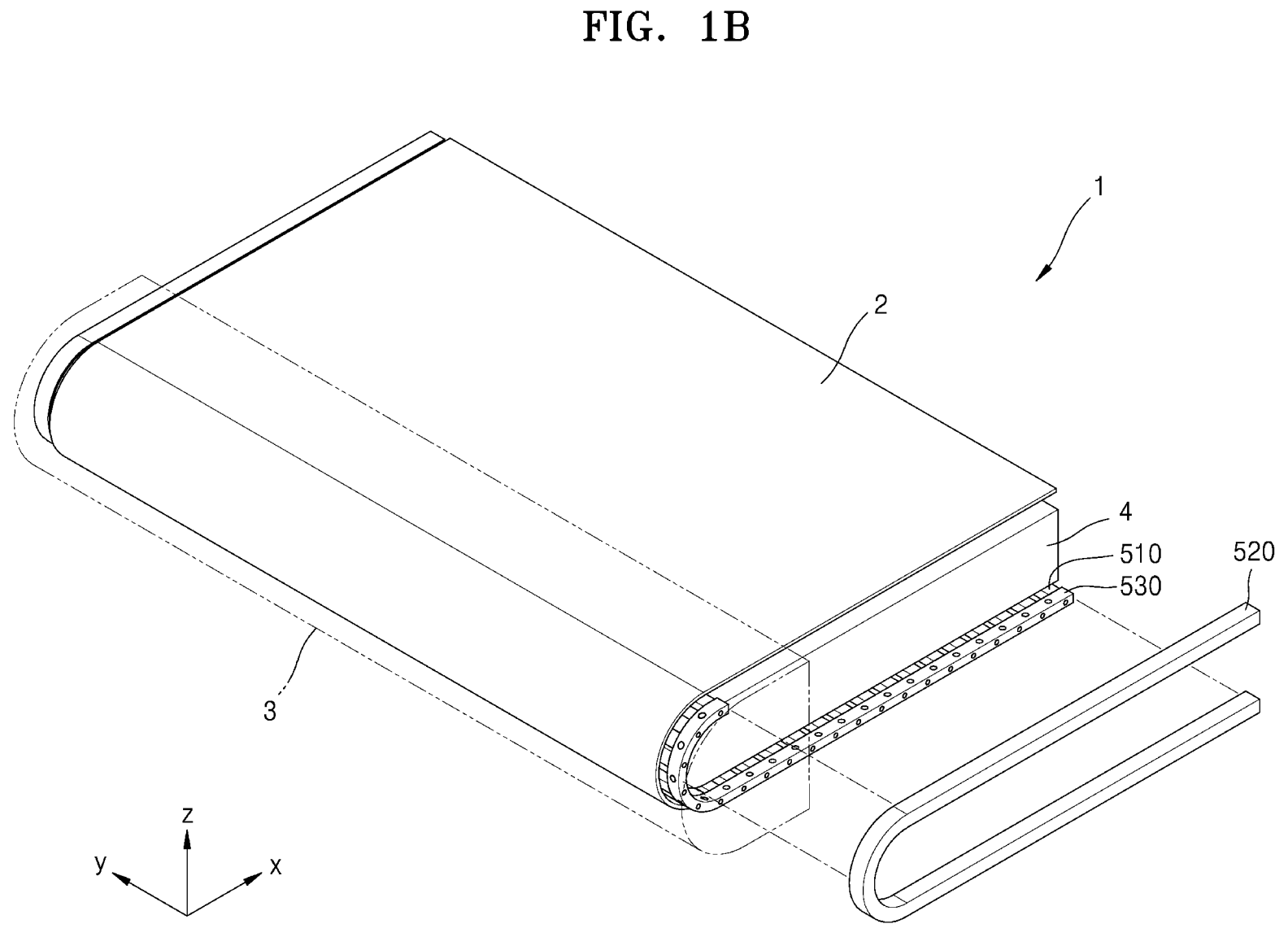
Figure 2:
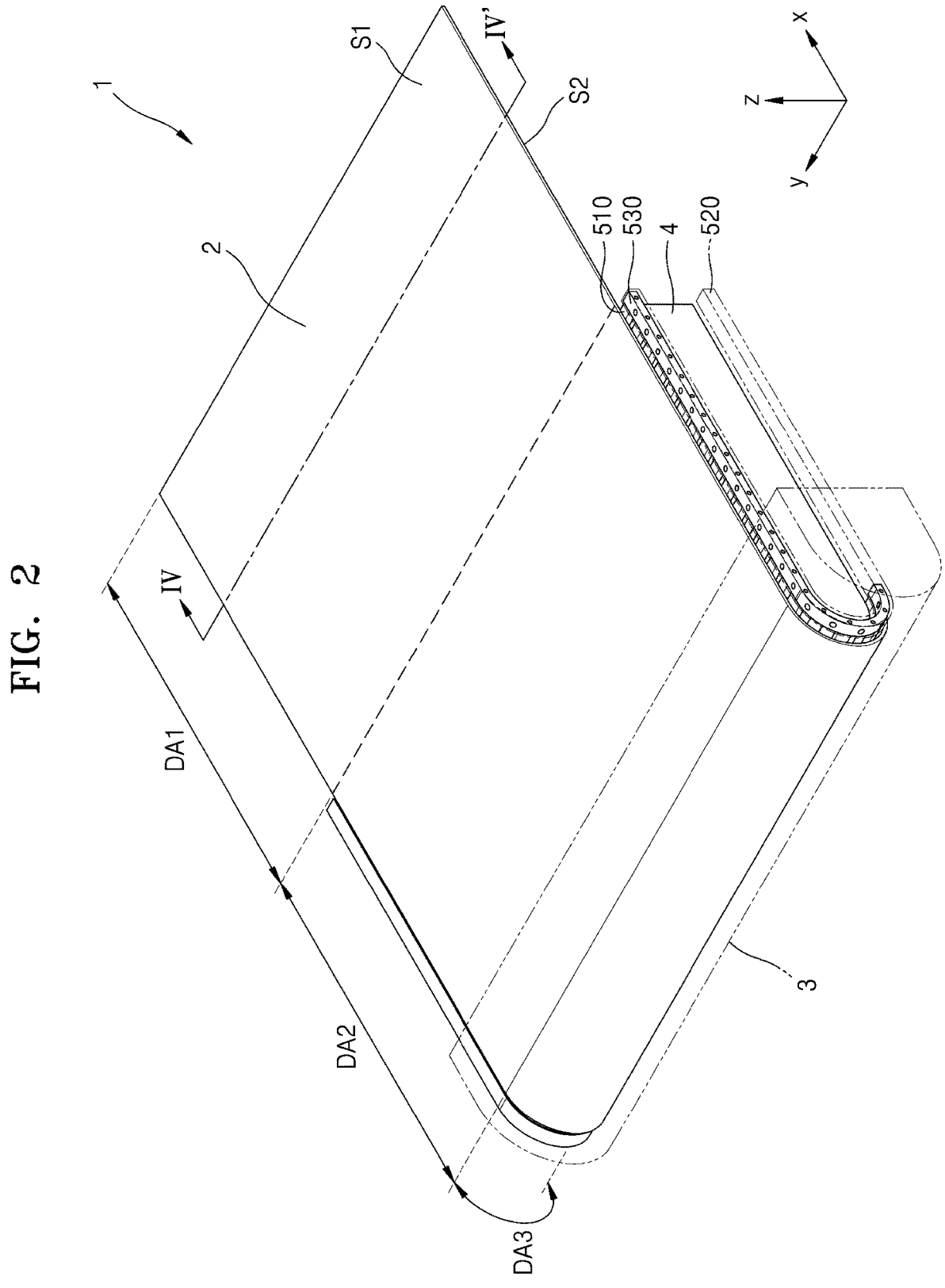
FIG. 2 is a perspective view schematically illustrating a display apparatus in a slid-out state, according to an embodiment.

FIGS. 1A, 1B, and 2 are perspective views schematically illustrating a display apparatus 1 according to an embodiment. Particularly, FIG. 1A is a perspective view schematically illustrating the display apparatus 1 in a slid-in state, and FIG. 1B is an exploded perspective view schematically illustrating the display apparatus 1 in a slid-in state. FIG. 2 is a perspective view schematically illustrating the display apparatus 1 in a slid-out state.

Referring to FIGS. 1A, 1B, and 2, an embodiment of the display apparatus 1 may include a display module 2, a housing 3, and a support plate 4.

The display module 2 may be configured to display an image. The display module 2 may include a first display area DA1, a second display area DA2, and a peripheral area PA. The first display area DA1 and the second display area DA2 may be an image display area and may each include a plurality of pixels that emit light.

In an embodiment, the first display area DA1 may be a main display area. In an embodiment, for example, the first display area DA1 is an area that displays an image when the display apparatus 1 is in a slid-in state, as illustrated in FIG. 1A, and may be configured to display most of the image. In such an embodiment, the second display area DA2 may not be configured to display an image when the display apparatus 1 is accommodated in the housing 3, which will be described below.

In an embodiment, the second display area DA2 may be an auxiliary display area. In an embodiment, for example, the second display area DA2 is an area that displays an image when the display apparatus 1 is in a slid-out state, as illustrated in FIG. 2, and may be configured to display an expanded image together with the first display area DA1. In such an embodiment, the second display area DA2 may be drawn out from the housing 3 and may be configured to display an image.

The peripheral area PA is an area that does not display an image, and may be arranged to be accommodated in the housing 3 even when the display apparatus 1 is in a slid-out state, as illustrated in FIG. 2. In an embodiment, the peripheral area PA may be arranged on a side of the second display area DA2 opposite to a side on which the first display area DA1 is arranged.

The display module 2 may be partially bent in a slid-in state, so that one surface of the display module 2, for example, a first surface S1 acting as an image display surface, is arranged to face a second surface S2. In this case, a portion of the second display area DA2 may be bent in a slid-in state. In this case, the first display area DA1 and the remaining portion of the second display area DA2 may be substantially parallel to the peripheral area PA.

The display module 2 may slide and shift to a slid-out state. This may be performed in such a manner that the display module 2 slides along the side guide portion 520 to be described below. Accordingly, the display module 2 may slide in a first direction (e.g., the x direction of FIGS. 1A, 1B, and 2) so that the bent second display area DA2 becomes flat again. As illustrated in FIG. 2, in the slid-out state, the peripheral area PA may be accommodated in the housing 3 in a bent state.

In an embodiment, the display module 2 may be rolled or unrolled along the side guide portion 520. That is, the display module 2 may be folded or unfolded along the side guide portion 520. In such an embodiment, the rolling or unrolling of the display module 2 along the side guide portion 520 may mean that the display module 2 slides along the partially bent side guide portion 520 like a conveyor belt.

In an embodiment, the display module 2 may be driven by a driver (not illustrated) to be slidable. In such an embodiment, the driver, such as a motor, may be connected adjacent to one side of the display module 2, for example, the peripheral area PA, and may slide the display module 2. Alternatively, instead of being driven by the driver, the display module 2 may be slidable by being pulled by a user, that is, by being pulled by a user in the first direction while the user grips a portion adjacent to one side of the display module 2, for example, the first display area DA1. It will be understood that the driving force for sliding the display module 2 is not limited to the above description and various driving forces may be provided.

The housing 3 may accommodate the display module 2. Although only a portion of the housing 3 is illustrated in FIGS. 1A, 1B, and 2 for convenience of illustration and description, it would be understood that the housing 3 may further extend to surround the lower portion of the display apparatus 1 (e.g., the −z direction of FIG. 1A) to accommodate the second display area DA2 and the peripheral area PA in FIG. 1A. That is, in an embodiment, the housing 3 may be formed to expose only the first display area DA1 to the outside when the display apparatus 1 is in a slid-in state, as illustrated in FIGS. 1A and 1B.

The support plate 4 may be between the second surfaces S2 of the display module 2 facing each other. The support plate 4 may be fixedly connected to a portion of the housing 3. In an embodiment, the support plate 4 may be in contact with the second surface S2 of the display module 2 to support the display module 2. In an alternative embodiment, the support plate 4 may be spaced apart from the second surface S2 of the display module 2. In such an embodiment where the support plate 4 is spaced apart from the second surface S2, the support plate 4 may be connected to other members, for example, a member configured to drive the display module 2 to be drawn in and out, to support the members. Also, in an embodiment, the support plate 4 may be connected to the side guide portion 520 to fix the side guide portion 520. Hereinafter, for convenience of description, embodiments where the support plate 4 is spaced apart from the second surface S2 will be mainly described.

Figure 3:
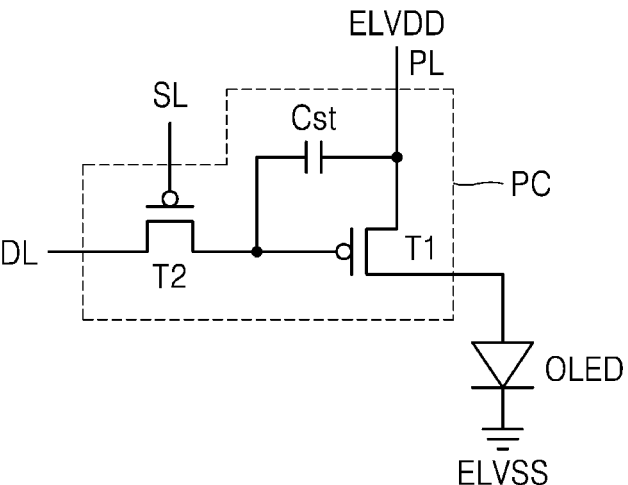
FIG. 3 is an equivalent circuit diagram schematically illustrating a pixel circuit included in a display module, according to an embodiment.

FIG. 3 is an equivalent circuit diagram schematically illustrating a pixel circuit PC included in a display module, according to an embodiment.

Referring to FIG. 3, an embodiment of the pixel circuit PC may be connected to a display element, for example, an organic light-emitting diode OLED.

The pixel circuit PC may include a driving thin-film transistor T1, a switching thin-film transistor T2, and a storage capacitor Cst. The organic light-emitting diode OLED may emit red light, green light, or blue light, or may emit red light, green light, blue light, or white light.

The switching thin-film transistor T2 may be connected to a scan line SL and a data line DL, and may be configured to transmit, to the driving thin-film transistor T1, a data signal or a data voltage input from the data line DL in response to a scan signal or a switching voltage input from the scan line SL. The storage capacitor Cst may be connected to the switching thin-film transistor T2 and a driving voltage line PL, and may be configured to store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may be configured to control a driving current flowing from the driving voltage line PL to the organic light-emitting diode OLED based on a voltage value stored in the storage capacitor Cst. The organic light-emitting diode OLED may emit light having a certain luminance corresponding to the driving current. An opposite electrode of the organic light-emitting diode OLED may be configured to receive a second power supply voltage ELVSS.

Although FIG. 3 illustrates an embodiment where the pixel circuit PC includes two thin-film transistors and one storage capacitor, but not being limited thereto.

Alternatively, the pixel circuit PC may include three or more thin-film transistors.

Figure 4:
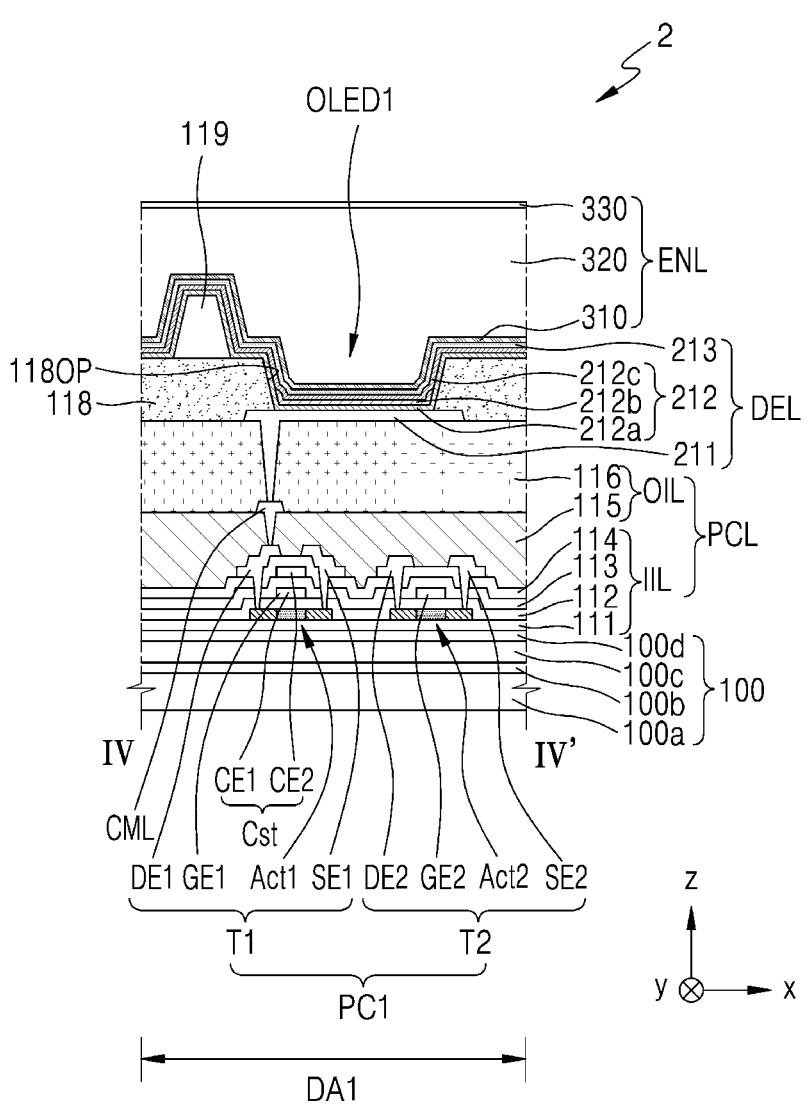
FIG. 4 is a cross-sectional view of the display module of FIG. 2 taken along line IV-IV' of FIG. 2, according to an embodiment.

FIG. 4 is a cross-sectional view schematically illustrating the display module 2 according to an embodiment. Particularly, FIG. 4 is a cross-sectional view of the display module 2 of FIG. 2 taken along line IV-IV' of FIG. 2.

Referring to FIG. 4, in an embodiment, the display module 2 may include a display panel 10, and the display panel 10 may include a substrate 100, a buffer layer 111, a pixel circuit layer PCL, a display element layer DEL, and an encapsulation layer ENL.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked in this stated order and provided in the substrate 100. In an alternative embodiment, the substrate 100 may include glass.

At least one selected from the first base layer 100a and the second base layer 100c may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d are barrier layers configured to prevent infiltration of foreign matter, and may include a single layer or layers including an inorganic material, such as silicon nitride ($SiN_x$), silicon oxide ($SiO_2$), and/or silicon oxynitride (SiON).

The pixel circuit layer PCL may be disposed on the substrate 100. The pixel circuit layer PCL may include a pixel circuit. In an embodiment, the pixel circuit layer PCL may include a plurality of pixel circuits. In an embodiment, a first pixel circuit PC1 of the pixel circuits may include a driving thin-film transistor T1, a switching thin-film transistor T2, and a storage capacitor Cst.

The pixel circuit layer PCL may include an inorganic insulating layer IIL and an organic insulating layer OIL, which are disposed below or/and above the elements of the driving thin-film transistor T1. The inorganic insulating layer IIL may include a buffer layer 111, a first gate insulating layer 112, a second gate insulating layer 113, and an interlayer insulating layer 114. The organic insulating layer OIL may include a first organic insulating layer 115 and a second organic insulating layer 116. The driving thin-film transistor T1 may include a first semiconductor layer Act1, a first gate electrode GE1, a first source electrode SE1, and a first drain electrode DE1.

The buffer layer 111 may be disposed on the substrate 100. The buffer layer 111 may include an inorganic insulating material, such as silicon nitride ($SiN_x$), silicon oxynitride (SiON), and silicon oxide ($SiO_2$), and may be defined by a single layer or multi-layers, each layer including at least one selected from the inorganic insulating materials described above.

The first semiconductor layer Act1 may be disposed on the buffer layer 111. The first semiconductor layer Act1 may include polysilicon. Alternatively, the first semiconductor layer Act1 may include amorphous silicon, an oxide semiconductor, or an organic semiconductor. The first semiconductor layer Act1 may include a channel region, and a drain region and a source region respectively on opposing sides of the channel region.

The first gate electrode GE1 may overlap the channel region. The first gate electrode GE1 may include a low-resistance metal material. The first gate electrode GE1 may include a conductive material including molybdenum (Mo), aluminum (Al), copper (Cu), titanium (Ti), or the like, and may be defined by a single layer or multi-layers, each layer including at least one selected from the conductive materials described above.

The first gate insulating layer 112 between the first semiconductor layer Act1 and the first gate electrode GE1 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1.

Similar to the first gate insulating layer 112, the second gate insulating layer 113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

An upper electrode CE2 of the storage capacitor Cst may be disposed on the second gate insulating layer 113. The upper electrode CE2 may overlap the first gate electrode GE1 therebelow. In such an embodiment, the first gate electrode GE1 of the driving thin-film transistor T1 and the upper electrode CE2, which overlap each other with the second gate insulating layer 113 therebetween, may constitute the storage capacitor Cst. That is, the first gate electrode GE1 of the driving thin-film transistor T1 may function as a lower electrode CE1 of the storage capacitor Cst.

As described above, the storage capacitor Cst may overlap the driving thin-film transistor T1. In some embodiments, the storage capacitor Cst may not overlap the driving thin-film transistor T1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be defined by a single layer or multi-layers, each layer including at least one selected from the materials described above.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may be defined by a single layer or multi-layers, each layer including at least one selected from the inorganic insulating materials described above.

The first drain electrode DE1 and the first source electrode SE1 may be disposed on the interlayer insulating layer 114. The first drain electrode DE1 and the first source electrode SE1 may each include a material having high conductivity. The first drain electrode DE1 and the first source electrode SE1 may each include a conductive material including molybdenum (Mo), aluminum (Al), copper (Cu), titanium (Ti), or the like, and may each be defined by a single layer or multi-layers, each layer including at least one selected from the conductive materials described above. In an embodiment, the first drain electrode DE1 and the first source electrode SE1 may each have a multilayer structure of Ti/Al/Ti.

The switching thin-film transistor T2 may include a second semiconductor layer Act2, a second gate electrode GE2, a second drain electrode DE2, and a second source electrode SE2. Because the second semiconductor layer Act2, the second gate electrode GE2, the second drain electrode DE2, and the second source electrode SE2 are respectively similar to the first semiconductor layer Act1, the first gate electrode GE1, the first drain electrode DE1, and the first source electrode SE1, any repetitive detailed descriptions thereof are omitted.

The first organic insulating layer 115 may be disposed to cover the first drain electrode DE1 and the first source electrode SE1. The first organic insulating layer 115 may include an organic material. In an embodiment, for example, the first organic insulating layer 115 may include at least one organic material selected from general-purpose polymer, such as polymethylmethacrylate (PMMA) or polystyrene (PS), polymer derivatives having a phenolic group, acrylic polymer, imide-based polymer, aryl ether-based polymer, amide-based polymer, fluorine-based polymer, p-xylene-based polymer, vinyl alcohol-based polymer, and any blend thereof.

A connection electrode CML may be disposed on the first organic insulating layer 115. In an embodiment, the connection electrode CML may be connected to the first drain electrode DE1 or the first source electrode SE1 through a contact hole defined in the first organic insulating layer 115. The connection electrode CML may include a material having high conductivity. The connection electrode CML may include a conductive material including molybdenum (Mo), aluminum (Al), copper (Cu), titanium (Ti), or the like, and may be defined by a single layer or multi-layers, each layer including at least one selected from the conductive materials described above. In an embodiment, the connection electrode CML may have a multilayer structure of Ti/Al/Ti.

The second organic insulating layer 116 may be disposed to cover the connection electrode CML. The second organic insulating layer 116 may include an organic material. The second organic insulating layer 116 may include at least one organic insulating material selected from general-purpose polymer, such as PMMA or PS, polymer derivatives having a phenolic group, acrylic polymer, imide-based polymer, aryl ether-based polymer, amide-based polymer, fluorine-based polymer, p-xylene-based polymer, vinyl alcohol-based polymer, and any blend thereof.

The display element layer DEL may be disposed on the pixel circuit layer PCL. The display element layer DEL may include a display element. In an embodiment, the display element layer DEL may include a plurality of display elements. A first organic light-emitting diode OLED1 may be arranged in the first display area DA1 as a first display element.

A pixel electrode 211 of the first organic light-emitting diode OLED1 may be electrically connected to the connection electrode CML through a contact hole defined in the second organic insulating layer 116. Accordingly, the first organic light-emitting diode OLED1 may be electrically connected to the first pixel circuit PC1.

The pixel electrode 211 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In an alternative embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In another alternative embodiment, the pixel electrode 211 may further include a layer including ITO, IZO, ZnO, or $In_2O_3$ above and/or below the reflective layer.

A pixel defining layer 118, in which an opening 1180P exposing the central portion of the pixel electrode 211 is defined, may be disposed on the pixel electrode 211. The pixel defining layer 118 may include an organic insulating material and/or an inorganic insulating material. The opening 1180P may define an emission area of light emitted from the first organic light-emitting diode OLED1. In an embodiment, for example, the width of the opening 1180P may correspond to the width of the emission area.

A spacer 119 may be disposed on the pixel defining layer 118. In an embodiment, when manufacturing the display panel 10, a mask sheet may be used. In such an embodiment, the mask sheet may enter the opening 1180P of the pixel defining layer 118, or may be in close contact with the pixel defining layer 118. The spacer 119 may prevent defects in which a portion of the substrate 100 and a portion of the multilayer layer on the substrate 100 are damaged by the mask sheet when a deposition material is deposited on the substrate 100.

The spacer 119 may include an organic material, such as polyimide. Alternatively, the spacer 119 may include an inorganic insulating material, such as silicon nitride ($SiN_x$) or silicon oxide ($SiO_2$), or may include an organic insulating material and an inorganic insulating material.

In an embodiment, the spacer 119 may include a material different from that of the pixel defining layer 118. Alternatively, the spacer 119 may include a same material as that of the pixel defining layer 118. In such an embodiment, the pixel defining layer 118 and the spacer 119 may be formed together in a mask process using a halftone mask or the like.

An intermediate layer 212 may be disposed on the pixel defining layer 118. The intermediate layer 212 may include an emission layer 212b in the opening 1180P of the pixel defining layer 118. The emission layer 212b may include a high molecular weight organic material or a low molecular weight organic material that emits light of a certain color.

A first functional layer 212a and a second functional layer 212c may be disposed below and above the emission layer 212b, respectively. The first functional layer 212a may include, for example, a hole transport layer (HTL), or may include an HTL and a hole injection layer (HIL). The second functional layer 212c is an element disposed on the emission layer 212b and may be optional. The second functional layer 212c may include an electron transport layer (ETL) and/or an electron injection layer (EIL). The first functional layer 212a and/or the second functional layer 212c may be a common layer completely covering the substrate 100 like an opposite electrode 213 to be described below.

The opposite electrode 213 may include a conductive material having a low work function. In an embodiment, for example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 213 may further include a layer including ITO, IZO, ZnO, or $In_2O_3$ on the (semi)transparent layer including at least one selected from the materials described above.

In some embodiments, a capping layer (not illustrated) may be further disposed on the opposite electrode 213. The capping layer may include LiF, an inorganic material, and/or an organic material.

The encapsulation layer ENL may be disposed on the opposite electrode 213. In an embodiment, the encapsulation layer ENL may include at least one inorganic encapsulation layer and at least one organic encapsulation layer. In an embodiment, FIG. 4 illustrates that the encapsulation layer ENL includes a first inorganic encapsulation layer 310, an organic encapsulation layer 320, and a second inorganic encapsulation layer 330, which are sequentially stacked in this stated order.

The first inorganic encapsulation layer 310 and the second inorganic encapsulation layer 330 may include at least one inorganic material selected from aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and silicon oxynitride (SiON). The organic encapsulation layer 320 may include a polymer-based material. The polymer-based material may include acrylic resin, epoxy-based resin, polyimide, polyethylene, or the like. In an embodiment, the organic encapsulation layer 320 may include acrylate.

Although not illustrated, a touch electrode layer may be disposed on the encapsulation layer ENL, and an optical function layer may be disposed on the touch electrode layer. The touch electrode layer may be configured to obtain coordinate information in response to an external input, for example, a touch event. The optical function layer may reduce the reflectance of light (external light) incident from the outside toward the display apparatus, and/or may improve the color purity of light emitted from the display apparatus. In an embodiment, the optical function layer may include a retarder and/or a polarizer. The retarder may be a film-type retarder or a liquid crystal coating-type retarder, and may include a λ/2 retarder and/or a λ/4 retarder. The polarizer may be a film-type polarizer or a liquid crystal coating-type polarizer. The film-type retarder or polarizer may include a stretched synthetic resin film, and the liquid crystal coating-type retarder or polarizer may include liquid crystals arranged in a certain array. The retarder and the polarizer may each further include a protective film.

In an alternative embodiment, the optical function layer may include a black matrix and color filters. The color filters may be arranged by considering the color of light emitted from each of the pixels of the display panel. Each of the color filters may include a red, green, or blue pigment or dye. Alternatively, each of the color filters may further include, in addition to the pigment or dye, quantum dots. Alternatively, some color filters may not include the pigment or dye described above, and may include scattering particles, such as titanium oxide.

In alternative embodiment, the optical function layer may include a destructive interference structure. The destructive interference structure may include a first reflective layer and a second reflective layer on different layers from each other. First reflected light and second reflected light, which are respectively reflected from the first reflective layer and the second reflective layer, may destructively interfere with each other, and thus, the reflectance of external light may be reduced.

An adhesive member may be between the touch electrode layer and the optical function layer. In an embodiment, any general adhesive members known in the art may be employed as the adhesive member without limitation. The adhesive member may be a pressure sensitive adhesive (PSA).

Although not illustrated, in an embodiment where the touch electrode layer and/or the optical function layer are disposed on or above the encapsulation layer ENL, a cover window may be disposed above the touch electrode layer and/or the optical function layer. In such an embodiment, the cover window may be bonded to the display panel 10 by an adhesive member. In an embodiment, the cover window may be a flexible window. The cover window may protect the display panel 10 because the cover window is easily bent by external force without occurrence of cracks or the like. The cover window may include sapphire or plastic. In an embodiment, for example, the cover window may be ultra-thin glass or colorless polyimide.

In addition, although not illustrated, it will be understood that a member, such as a cushion layer, may be further disposed under the display panel 10, and accordingly, the display module 2 may be manufactured.

Figure 5:
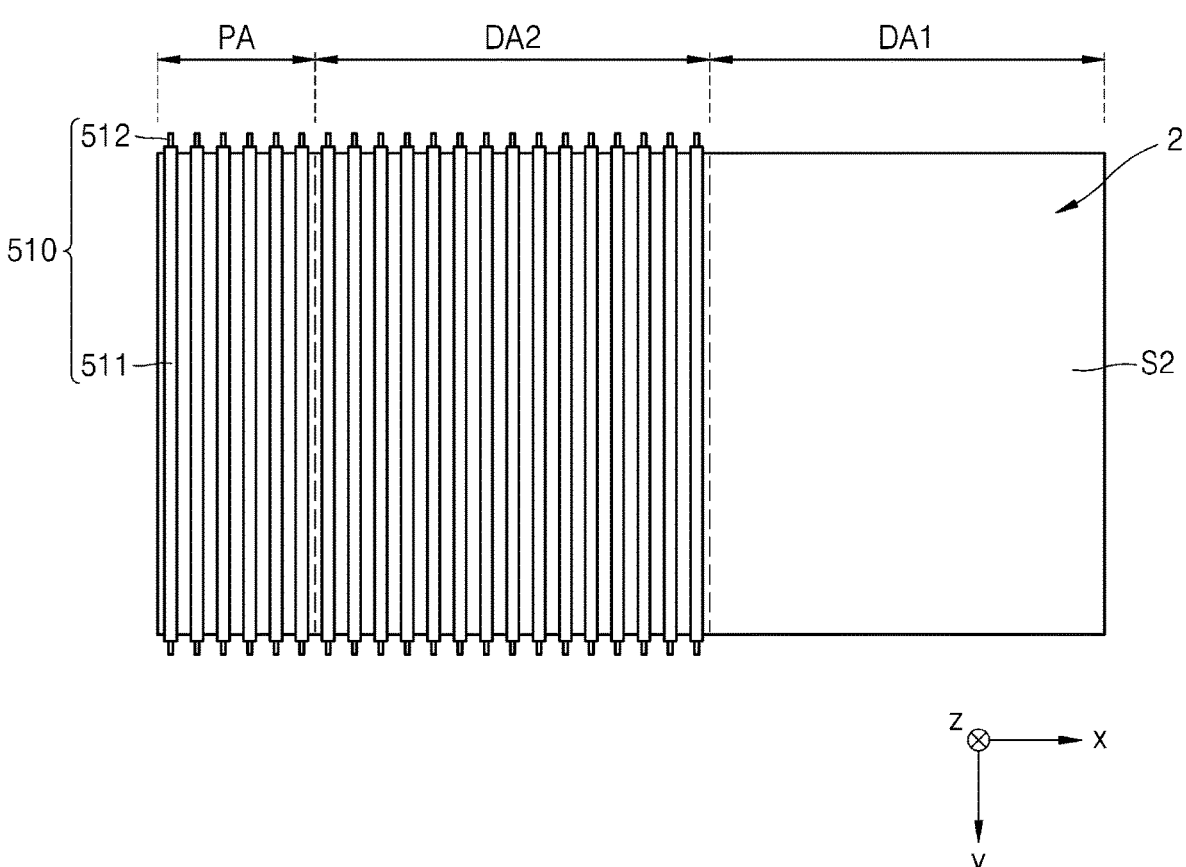
FIG. 5 is a rear view schematically illustrating a display module according to an embodiment.

FIG. 5 is a rear view schematically illustrating a display module 2 according to an embodiment. Particularly, FIG. 5 illustrates an embodiment where the display module 2 is in a completely flat state and has a second surface S2 that faces a first surface acting as a display surface.

Referring to FIG. 5, a moving bar 510 may be disposed on the second surface S2 of the display module 2. The moving bar 510 may be elongated in a second direction (e.g., the y direction in FIG. 5) crossing a first direction (e.g., the x direction in FIG. 5) that is a direction in which the display module 2 slides. In an embodiment, the moving bar 510 may have an elongated square column shape. Also, the moving bar 510 may extend between opposing ends of the display module 2 in the second direction to have a length equal to or greater than a length of the display module 2 in the second direction. The moving bar 510 may be bonded to the second surface S2 of the display module 2 to support the display module 2 and/or connect the display module 2 to a sliding portion 530 to be described below.

In an embodiment, the moving bar 510 may be provided in plural, that is, a plurality of moving bars 510 may be provided, and the moving bars 510 may be spaced apart from each other in the first direction. In an embodiment, for example, the number of moving bars 510 may be determined so that moving bars 510 are arranged from a peripheral area PA to a second display area DA2. However, the disclosure is not limited thereto. In an embodiment, for example, the moving bar 510 may be entirely or partially arranged in the peripheral area PA, the second display area DA2, and the first display area DA1, may be partially arranged in the peripheral area PA and the second display area DA2, or may be entirely or partially arranged in the second display area DA2. Hereinafter, for convenience of description, embodiments where the moving bars 510 are arranged in the peripheral area PA and the second display area DA2 will be mainly described.

Figure 6:
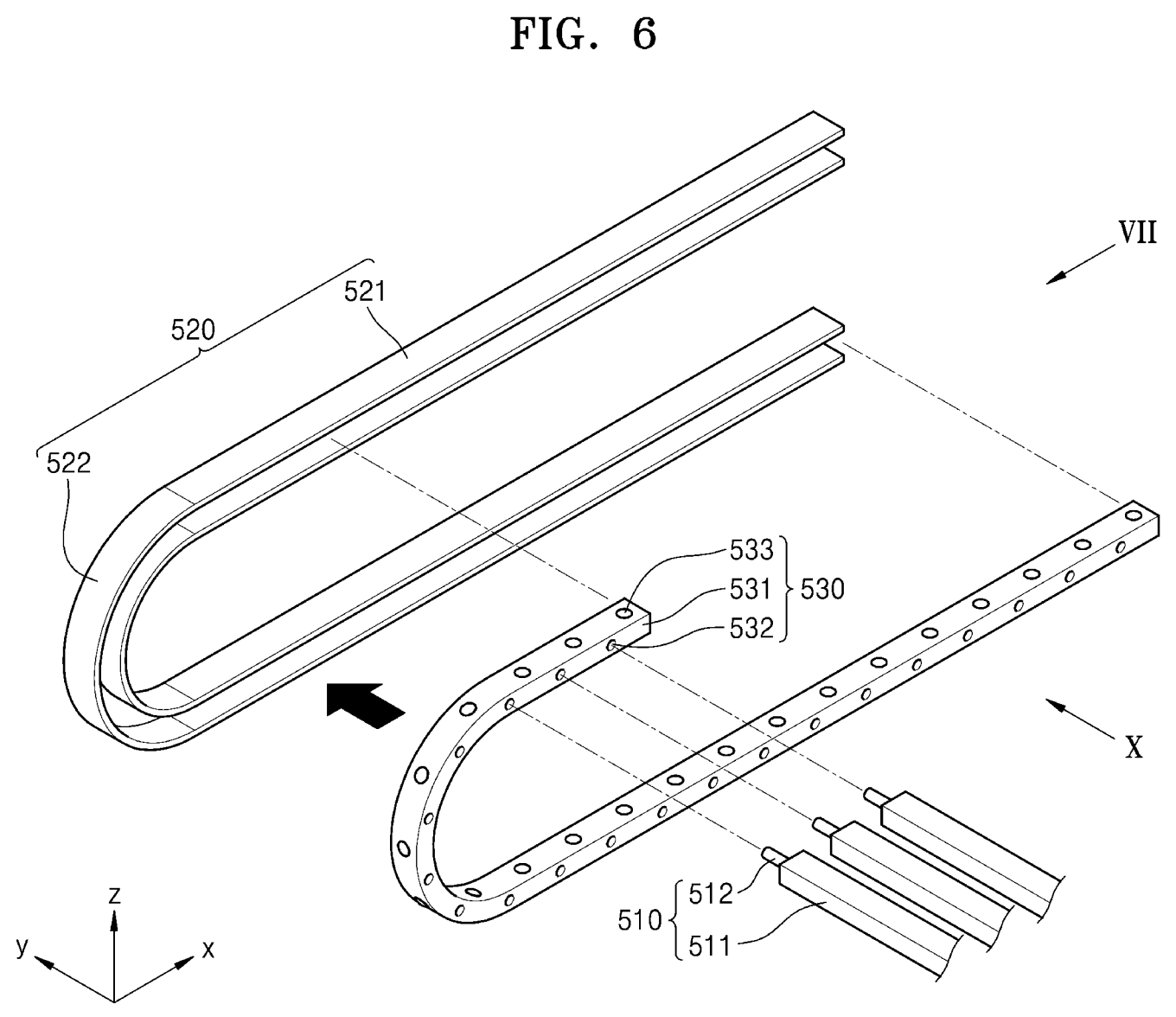

FIG. 6 is a perspective view schematically illustrating the side guide portion 520, the sliding portion 530, and the moving bar 510, according to an embodiment. FIG. 6 illustrates an exploded view of the side guide portion 520, the sliding portion 530, and the moving bar 510, which are arranged on the +y direction side of FIG. 1A for convenience of description.

Figure 7:
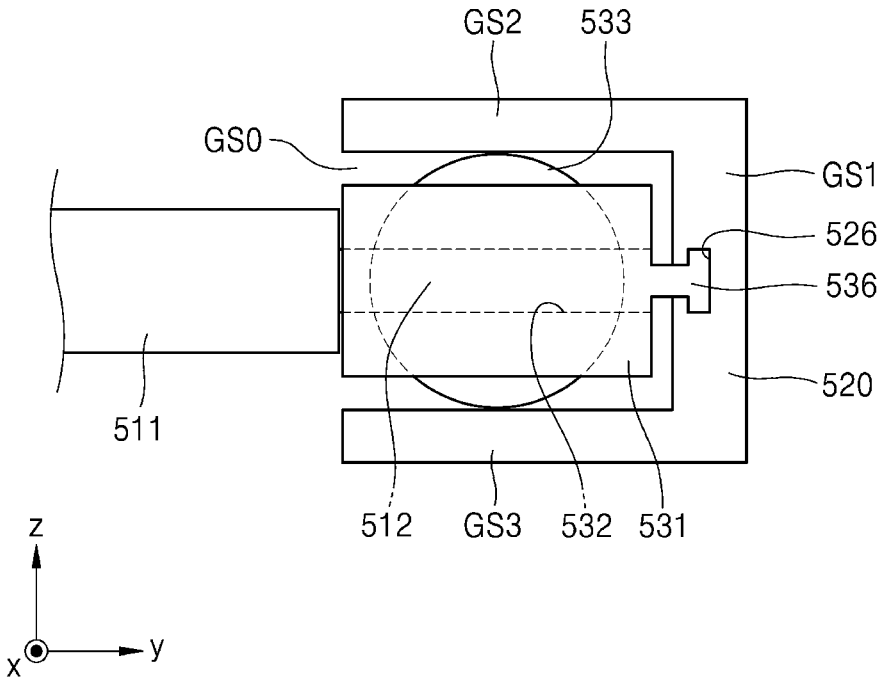
FIGS. 7 to 9 are diagrams illustrating the side guide portion when viewed from a VII direction of FIG. 6, according to various embodiments.
Figure 8:
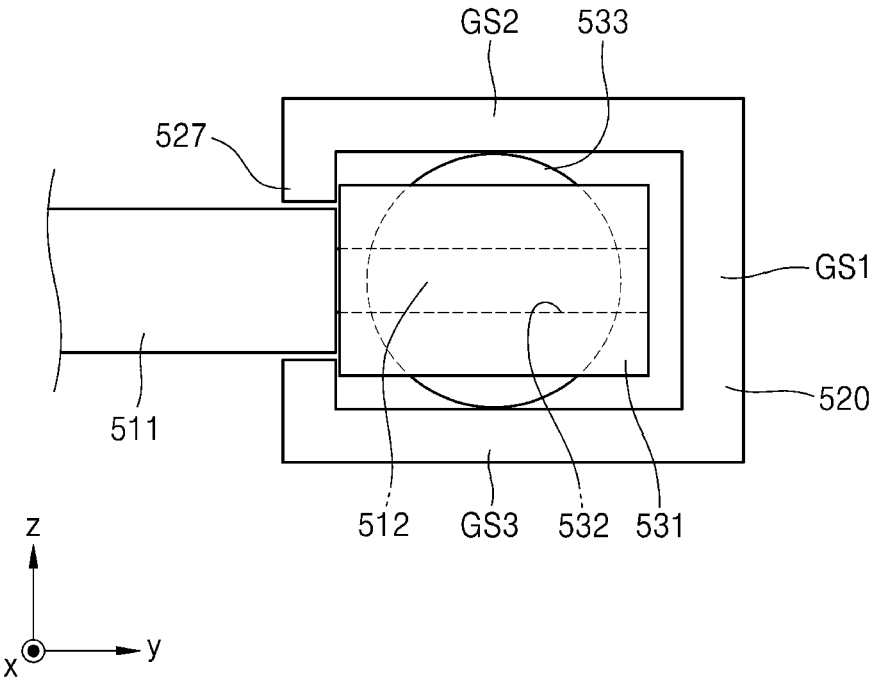
Figure 9:
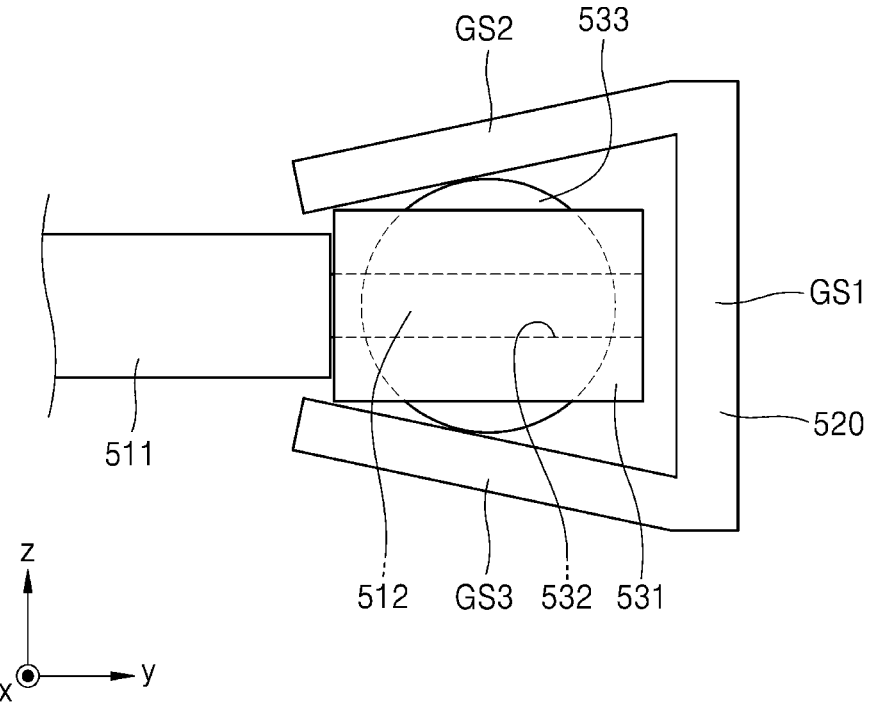

FIGS. 7 to 9 are diagrams illustrating the side guide portion 520 when viewed from a VII direction of FIG. 6, according to various embodiments.

Referring to FIG. 6, the side guide portions 520 may be respectively spaced apart from opposing ends of the display module (see 2 of FIG. 1A) in the second direction (e.g., the y direction in FIG. 1A). Because the side guide portions 520 at one end and the other end of the display module 2 in the second direction are similar to each other, the side guide portion 520 illustrated in FIG. 6 will be mainly described.

The side guide portion 520 may guide a sliding path so that the display module 2 slides in or slides out. In an embodiment, the side guide portion 520 may be elongated in the first direction (e.g., the x direction in FIG. 6) in which the display module 2 slides and may be bent at a point between both ends of the display module 2 in the longitudinal direction (i.e., the x direction in FIG. 6), and accordingly, the side guide portion 520 may have a U-shape. In an embodiment, for example, the side guide portion 520 may be bent at a middle point between opposing ends of the display module 2 in the longitudinal direction.

In an embodiment, the side guide portion 520 may include two first side guide portions 521 that have a straight shape, extend in the first direction, and face each other, and a second side guide portion 522 that has a curved shape and is between the two first side guide portions 521. In such an embodiment, the two first side guide portions 521 may be substantially parallel to each other and may have substantially a same length as each other. However, the disclosure is not limited thereto. Also, in an embodiment, the side guide portion 520 may be fixedly connected to the housing (see 3 of FIG. 1A), as described above.

Referring to FIGS. 6 and 7, in an embodiment, the side guide portion 520 may include a groove in a surface facing the display module 2 s to accommodate the sliding portion 530. In such an embodiment, when viewed from the VII direction of FIG. 6, the side guide portion 520 may include an open surface GS0, a first guide surface GS1 facing the open surface GS0, and a second guide surface GS2 and a third guide surface GS3 respectively connected to opposing ends of the open surface GS0 and facing each other.

In an embodiment, the side guide portion 520 may have a H-like-shaped cross-section when viewed from the first direction (e.g., the x direction in FIG. 7). That is, the second guide surface GS2 and the third guide surface GS3 may face each other and may be substantially parallel to each other. This may define an inner space in the side guide portion 520, and the sliding portion 530 may be accommodated in the inner space. In such an embodiment, a coupling groove 526 extending in the first direction may be disposed on one surface of the side guide portion 520, for example, the first guide surface GS1. A coupling protrusion 536 of the sliding portion 530 may be slidably fitted or inserted to the coupling groove 526. In an embodiment, a plurality of coupling protrusions 536 may be provided, and the coupling protrusions 536 may be spaced apart from each other in the first direction. Accordingly, the sliding portion 530 may not be separated from the side guide portion 520 while moving in the inner space of the side guide portion 520.

Referring to FIG. 8, in an alternative embodiment, the side guide portion 520 may further include protrusions 527 protruding toward each other at an end of the second guide surface GS2 adjacent to the open surface GS0 and an end of the third guide surface GS3 adjacent to the open surface GS0. In such an embodiment, the protrusion 527 may shield a portion of the open surface GS0 such that the sliding portion 530 may be prevented from being separated from the side guide portion 520 while moving in the inner space of the side guide portion 520.

Referring to FIG. 9, in another alternative embodiment, the second guide surface GS2 and the third guide surface GS3 of the side guide portion 520 may be inclined. In an embodiment, for example, the second guide surface GS2 and the third guide surface GS3 may be inclined to approach (or be closer to) each other as being toward the open surface GS0. Accordingly, the side guide portion 520 may have a trapezoidal cross-section when viewed from the first direction (e.g., the x direction in FIG. 9) such that the sliding portion 530 may be prevented from being separated from the side guide portion 520 while moving in the inner space of the side guide portion 520.

Figure 10:
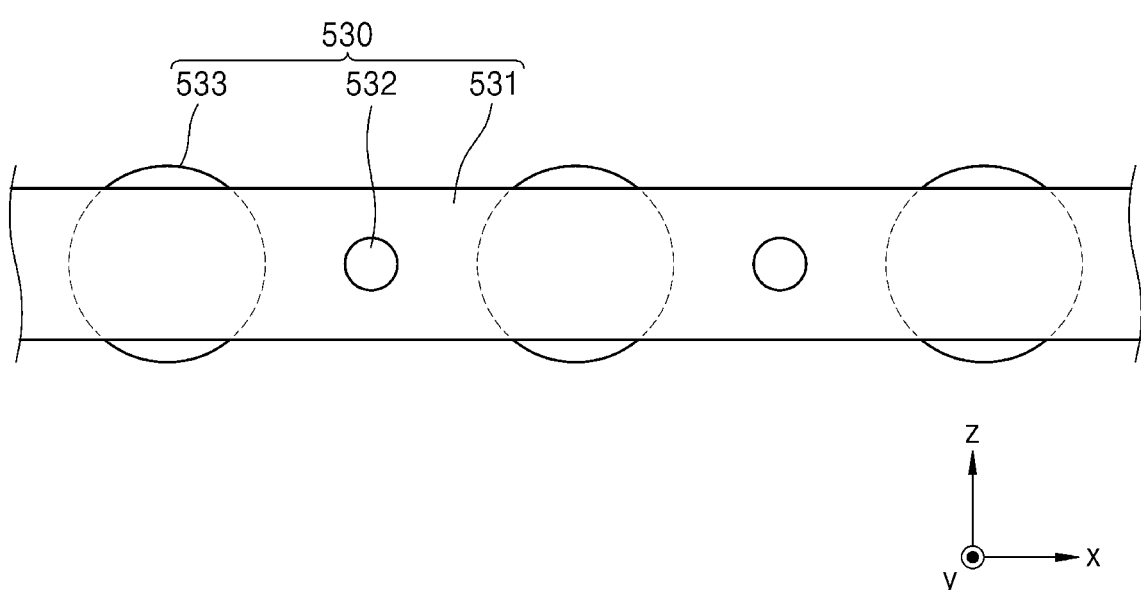
FIG. 10 is a front view schematically illustrating a sliding portion according to an embodiment.

FIG. 10 is a front view schematically illustrating the sliding portion 530 according to an embodiment. Particularly, FIG. 10 is a view of the sliding portion 530 of FIG. 6 when viewed from the x direction.

Referring to FIGS. 6 to 10, the sliding portion 530 may be accommodated in the groove of the side guide portion 520. The sliding portion 530 may be accommodated in the groove of the side guide portion 520 and may be slidable in the side guide portion 520.

In an embodiment, the sliding portion 530 may include a body portion 531, in which an accommodation hole 532 is defined, and a bearing 533.

The body portion 531 is a housing accommodating the accommodation hole 532 and the bearing 533. In an embodiment, the body portion 531 may include a flexible material. The flexible material refers to a bendable, foldable, or rollable material. Because the body portion 531 includes a flexible material, the body portion 531 may be flexibly bent and moved even in the bent portion of the side guide portion 520, that is, the second side guide portion 522. In an embodiment, the body portion 531 may be shorter than the side guide portion 520. Also, in an embodiment, the body portion 531 may have, for example, a rectangular column shape with a rectangular cross-section to be accommodated in the groove of the side guide portion 520. However, the disclosure is not limited thereto. In an alternative embodiment, for example, as illustrated in FIG. 9, where the side guide portion 520 has a trapezoidal cross-section, the body portion 531 may also have a trapezoidal cross-section. Hereinafter, embodiments where the body portion 531 has a rectangular column shape will be mainly described for convenience of description.

The bearing 533 may be arranged inside the body portion 531. The bearing 533 may be accommodated in the body portion 531, and a portion of the bearing 533, for example, upper and lower portions of the bearing 533 (the +z direction and the −z direction in FIG. 6) may be exposed to the outside of the body portion 531. In an embodiment, the bearing 533 may be a ball bearing. Alternatively, the bearing 533 may be a cylindrical bearing. Hereinafter, embodiments where the bearing 533 is a ball bearing will be mainly described for convenience of description.

The exposed portions of the bearing 533, that is, the upper and lower portions of the bearing 533 may be in contact with the second guide surface GS2 and the third guide surface GS3 of the side guide portion 520. Because the upper and lower portions of the bearing 533 are in contact with the side guide portion 520, the sliding portion 530 may be supported by the side guide portion 520 and may be smoothly slidable within the side guide portion 520 due to the rotation of the bearing 533.

In an embodiment, an accommodation hole 532 may be defined in the body portion 531 to entirely or partially passing through the body portion 531 in the second direction (e.g., the y direction in FIGS. 6 and 10). As illustrated in FIGS. 7 to 9, the accommodation hole 532 may be defined entirely through the body portion 531, but the disclosure is not limited thereto. The accommodation hole 532 may be partially formed through the body portion 531 in a form of a recess. The accommodation hole 532 may accommodate the moving bar 510 and may be coupled to the moving bar 510.

In an embodiment, the moving bar 510 may include a first bar 511 bonded to the lower portion of the display module 2 to support the display module 2, and a second bar 512 connected to opposing ends of the first bar 511 and coupled to the accommodation hole 532. Because the accommodation hole 532 and the second bar 512 are coupled to each other, the moving bar 510 may be moved as the sliding portion 530 slides, and accordingly, the display module 2 may be moved. In an embodiment, the cross-section of the second bar 512 may be smaller than the cross-section of the first bar 511. Therefore, when the moving bar 510 is coupled to the sliding portion 530, the first bar 511 may act as a locking jaw so that the moving bar 510 is inserted into the sliding portion 530 only to a certain extent.

In an embodiment, the accommodation hole 532 may have a circular cross-section when viewed from the second direction (e.g., the y direction in FIGS. 6 and 10), and accordingly, the second bar 512 may also have a circular cross-sectional shape. However, the disclosure is not limited thereto. It will be understood that the cross section of the accommodation hole 532 and the second bar 512 corresponding thereto may be a polygonal shape, such as a rectangular shape, or a cross shape.

In an embodiment, a plurality of bearings 533 and a plurality of accommodation holes 532 may be provided. The bearings 533 and the accommodation holes 532 may be spaced apart from each other in the longitudinal direction of the sliding portion 530, specifically, the body portion 531. In such an embodiment, the bearings 533 and the accommodation holes 532 may be alternately arranged with each other. In such an embodiment, the accommodation hole 532 may be between two adjacent bearings 533, and the bearing 533 may be between two adjacent accommodation holes 532.

Such a structure may maintain an interval between the moving bars 510 that are coupled to the accommodation holes 532. Because the body portion 531 includes a flexible material, the body portion 531 is flexible. However, because the bearings 533 having rigidity are spaced apart from each other, the shape of the body portion 531 may be maintained. Accordingly, the interval between the moving bars 510 coupled to the accommodation holes 532 may be maintained. This effect may be further emphasized, in particular, when the sliding portion 530 slides the curved second side guide portion 522. in an embodiment, as shown in FIGS. 6 and 10, one accommodation hole 532 may be defined between two adjacent bearings 533, but the disclosure is not limited thereto. In an alternative embodiment, for example, two accommodation holes 532 may be between two adjacent bearings 533.

As described above, the display apparatus 1 according to an embodiment may implement smoother sliding of the display module 2 through the side guide portion 520 and the sliding portion 530. In such an embodiment, the bearing 533 of the sliding portion 530 may reduce the contact area with respect to the side guide portion 520 and rotate to reduce frictional force, thereby implementing smoother sliding. Also, driving force required to implement the sliding of the display module 2 may be reduced. Also, because the interval between the moving bars 510 is maintained constant, the display module 2 may be effectively prevented from being folded or wrinkled. Accordingly, defects of the display module 2 may be effectively prevented.

Figure 11:
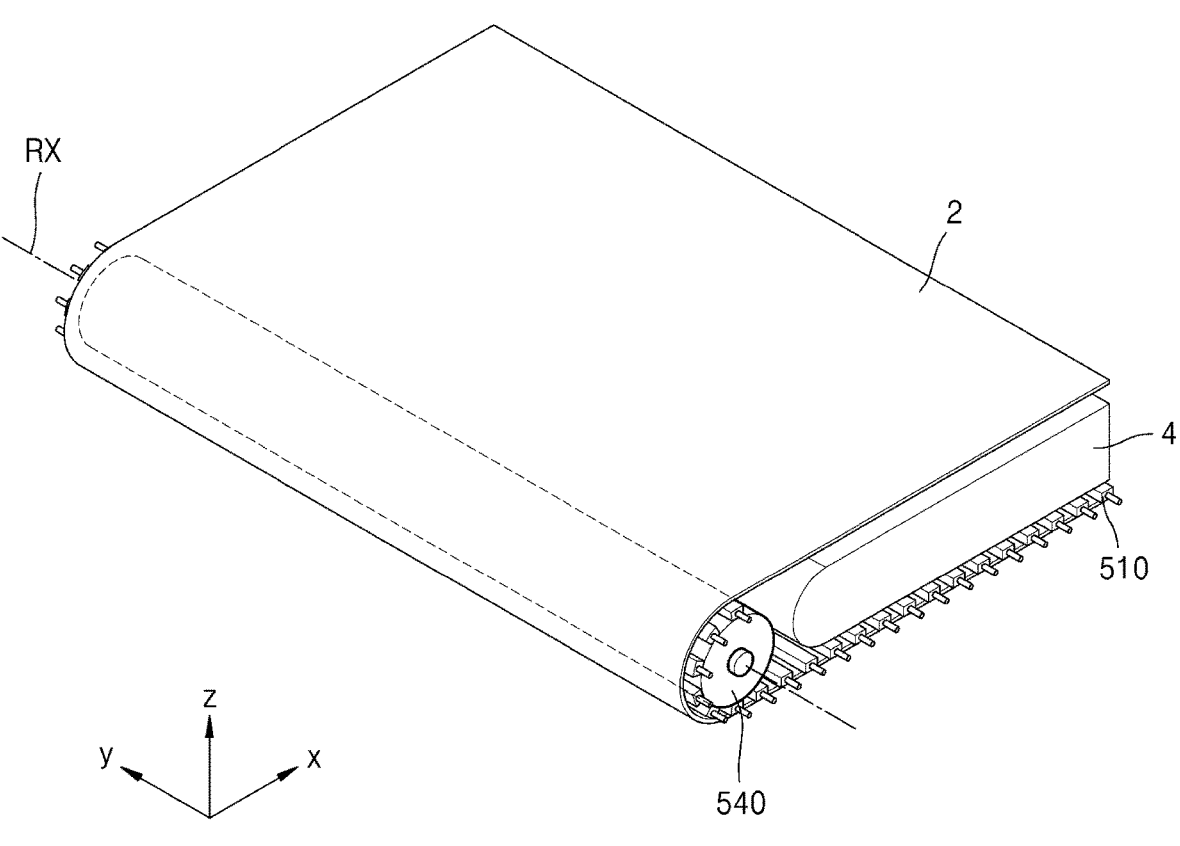
FIG. 11 is a perspective view schematically illustrating a display apparatus according to an alternative embodiment.

FIG. 11 is a perspective view schematically illustrating a display apparatus according to an alternative embodiment. In FIG. 11, some elements of the display apparatus 1 are omitted for convenience of description. Because the embodiment of the display apparatus shown in FIG. 11 is similar to the embodiments of the display apparatus 1 described above, only differences will be mainly described.

Referring to FIG. 11, an embodiment of the display apparatus may further include a central guide portion 540. The central guide portion 540 may be arranged adjacent to a support plate 4. In an embodiment, the central guide portion 540 may extend between the side guide portions (see 520 of FIG. 1) arranged at opposing ends of the display module 2 in the second direction (e.g., the y direction in FIG. 11) that is the width direction of the display module 2. Also, the central guide portion 540 may have a cylindrical shape and rotate about a rotational axis RX of the second direction. The central guide portion 540 is in direct or indirect contact with a portion of the display module 2, for example, a bent portion, so that the display module 2 may be slidable more smoothly in the first direction (e.g., the x direction in FIG. 11). In an embodiment where the central guide portion 540 is in indirect contact with the display module 2, the central guide portion 540 may be in contact with a plurality of moving bars 510 disposed on a second surface (see S2 of FIGS. 2 and 5) of the display module 2. The cylindrical curvature of the central guide portion 540 may be substantially equal to the curvature of the bent portion of the display module 2. In such an embodiment, the cylindrical curvature of the central guide portion 540 may be substantially equal to the curvature of the curved second side guide portion (see 522 of FIG. 6). In an embodiment, the cylindrical diameter of the central guide portion 540 may be greater than the thickness of the support plate 4 (e.g., the length of the support plate 4 in the z direction in FIG. 11).

In an embodiment, the central guide portion 540 may be rotated by a guide driver (not illustrated). Accordingly, the central guide portion 540 may rotate about the rotational axis RX, and the display module 2 in direct or indirect contact with the central guide portion 540, e.g., the bent portion of the display module 2, may slide more smoothly in the first direction while maintaining the curvature.

Alternatively, the central guide portion 540 may not be rotated by the guide driver (not illustrated). In such an embodiment, the central guide portion 540 may freely rotate about the rotational axis RX. In such an embodiment, the central guide portion 540 may include a material having a low friction coefficient, so that the display module 2, e.g., the bent portion of the display module 2, slides more smoothly while maintaining the curvature. Hereinafter, for convenience of description, embodiments where the central guide portion 540 is rotated by the guide driver (not illustrated) will be mainly described.

In an embodiment, a tooth portion (not illustrated) may be arranged on the outer circumferential surface of the central guide portion 540. A plurality of tooth portions may be arranged along the outer circumferential surface of the central guide portion 540, for example, in a gear-like shape. In such an embodiment, the tooth portions of the central guide portion 540 may be engage with the moving bars 510 disposed on the second surface S2 of the display module 2. Accordingly, the sliding of the display module 2 may be made more smoothly by the rotation of the central guide portion 540.

Figure 12:
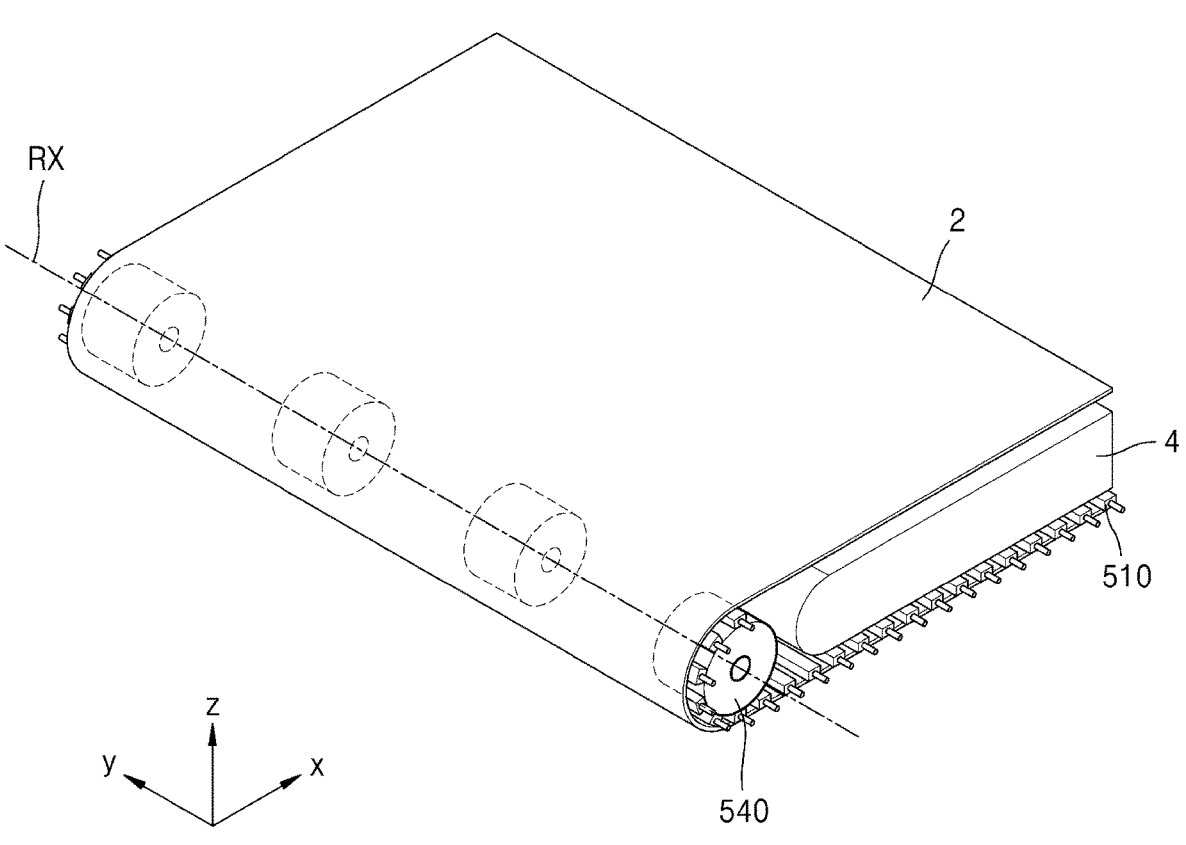
FIGS. 12 to 14 are perspective views schematically illustrating a central guide portion according to alternative embodiment.
Figure 13:
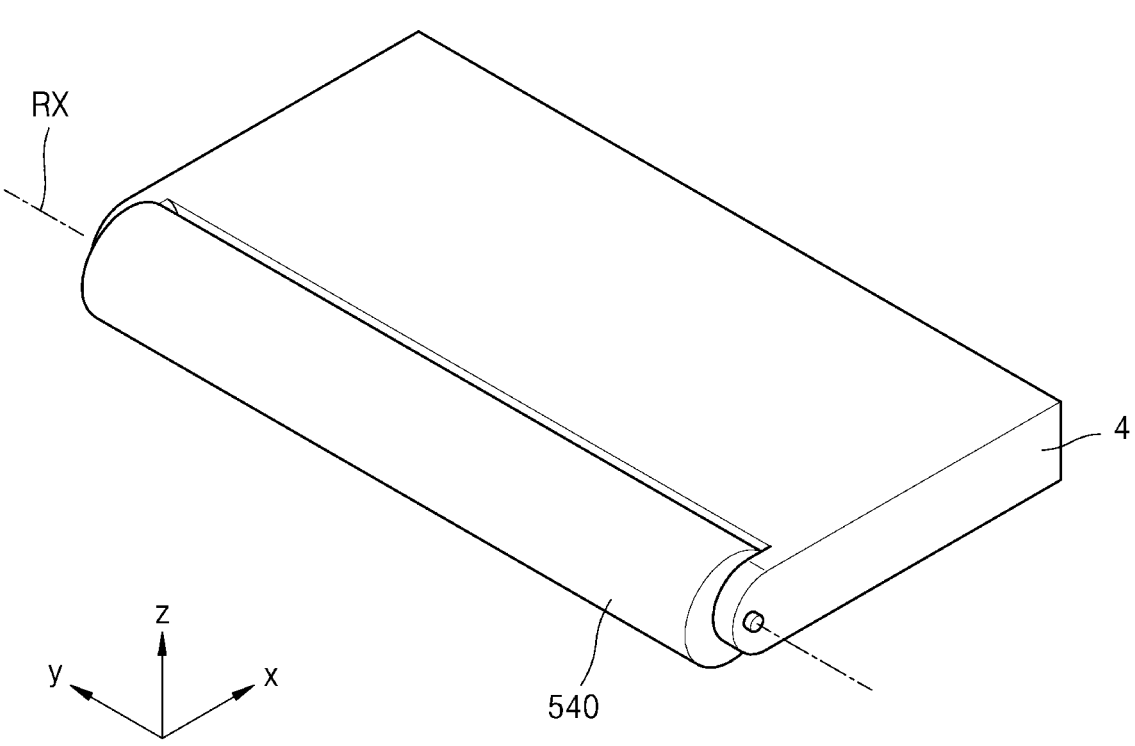
Figure 14:
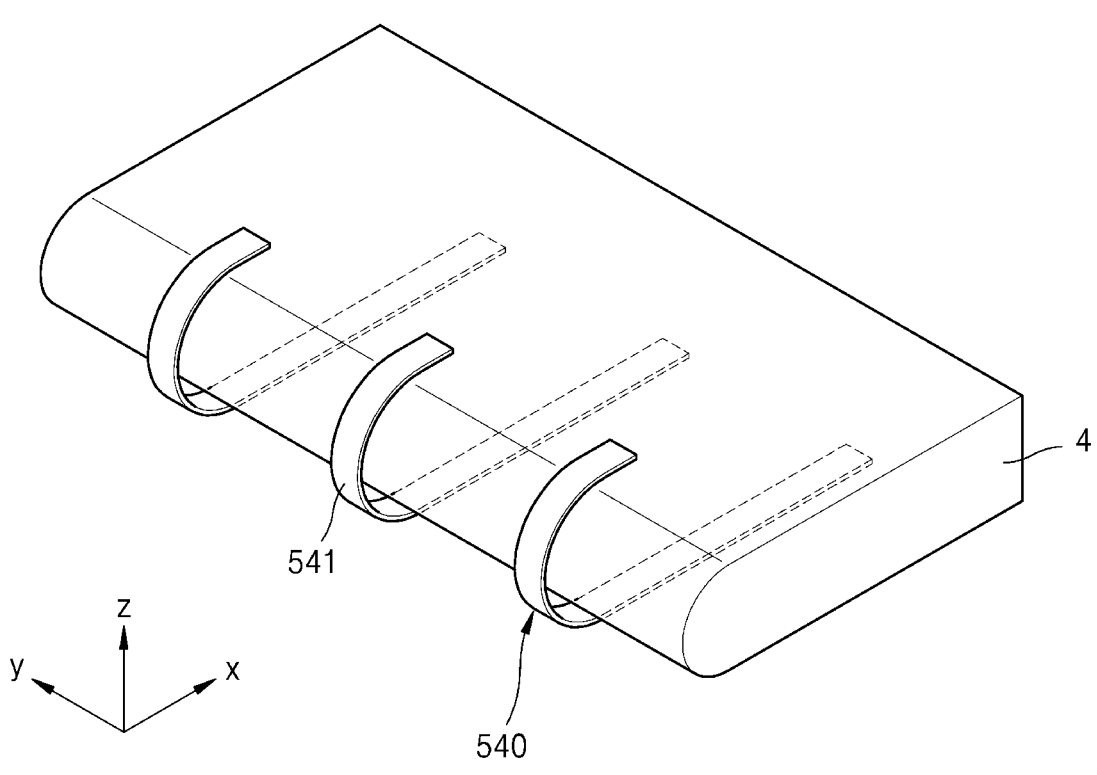

FIGS. 12 to 14 are perspective views schematically illustrating a central guide portion according to alternative embodiments. FIGS. 12 to 14 illustrate only some elements of the display apparatus for convenience of description. Because embodiments of a central guide portion 540 shown in FIGS. 12 to 14 is similar to the embodiment of the central guide portion 540 described above, only differences will be mainly described.

Referring to FIG. 12, in an embodiment, the central guide portion 540 may be provided in the form of a plurality of rollers or bearings rotating about a rotational axis RX of a second direction (e.g., the y direction in FIG. 12). In such an embodiment, the inner space of the housing (see 3 of FIG. 1A) may be further secured. As described above, a plurality of central guide portions 540 may be spaced apart in the second direction, and the interval between the central guide portions 540 may define a space to be used for or occupied by other constituent members.

Referring to FIG. 13, in an alternative embodiment, the central guide portion 540 may have a cylindrical shape extending in the second direction, as illustrated in FIG. 11. In such an embodiment, the central guide portion 540 may be partially accommodated in a support plate 4 and may be rotatable about the rotational axis RX. Also, the cylindrical diameter of the central guide portion 540 may be greater than the thickness of the support plate 4. Because a portion of the central guide portion 540 is accommodated in the support plate 4 and the remaining portion of the central guide portion 540 is exposed, the central guide portion 540 may be in direct or indirect contact with a display module 2, as described above. In addition, the central guide portion 540 is integrated with the support plate 4 to further secure the inner space of the housing (see 3 of FIG. 1A).

Referring to FIG. 14, in an alternative embodiment, the central guide portion 540 may include a plurality of push bars 541. The central guide portion 540, specifically, the push bar 541, may be between opposing ends of the display module 2 in the second direction (e.g., the y direction in FIG.

14) that is the width direction of the display module 2, as described above. The push bars 541 may be spaced apart from each other in the second direction. In such an embodiment, each of the push bars 541 may be arranged to surround a portion of the support plate 4, specifically, a portion corresponding to the bent portion of the display module 2 and having a curvature. That is, the push bar 541 may be bent so that a portion thereof has a curvature. The curvature of the push bar 541 may be substantially equal to the curvature of the second side guide portion (see 522 of FIG. 6) that bends the display module 2. In an embodiment, one end of the push bar 541, for example, the end arranged in the lower portion of the support plate 4 (the −z direction in FIG. 14) may be connected to a guide driver (not illustrated) and moved by the guide driver. In such an embodiment, the push bar 541 may be bonded to the lower surface of the moving bar 510, and may be moved by the guide driver to enable the moving bar 510 to be moved. This may provide driving force to make the display module 2 slide more smoothly. In addition, because a separate element having a large volume is not included, the inner space of the housing (see 3 of FIG. 1A) may be further secured.

According to one or more embodiments, the display apparatus, specifically, the display module, may slide smoothly, and thus damage due to tension or compression may be prevented in the bent portion.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a display module;
a plurality of moving bars disposed on a surface opposite to a display surface of the display module;
sliding portions coupled to opposing ends of the plurality of moving bars in a longitudinal direction; and
side guide portions which accommodate the sliding portions and guide sliding of the sliding portions, respectively,
wherein
each of the sliding portions comprises a plurality of bearings spaced apart in the longitudinal direction,
the plurality of bearings is in contact with a corresponding side guide portion of the side guide portions,
the sliding portions include a flexible material and are configured to be bent, folded, or rolled while sliding along the side guide portions.

2. The display apparatus of claim 1, wherein
a plurality of accommodation holes is defined in each of the sliding portions, and
the plurality of moving bars is inserted in the plurality of accommodation holes, respectively.

3. The display apparatus of claim 2, wherein each of the plurality of moving bars comprises:
a first bar connected to the display module; and
a second bar connected to each of opposing ends of the first bar in the longitudinal direction and coupled to a corresponding one of the plurality of accommodation holes, and a cross-section of the second bar is smaller than a cross-section of the first bar.

4. The display apparatus of claim 1, wherein each of the side guide portions comprises:

first side guide portions which have a straight shape, extend in a first direction crossing the longitudinal direction, and face each other; and a second side guide portion which has a curved shape and is between the first side guide portions.

5. The display apparatus of claim 4, wherein the display module is slidable while being bent along a curvature of the second side guide portion.

6. The display apparatus of claim 4, wherein, when viewed from the first direction, each of the side guide portions includes an open surface, a first guide surface facing the open surface, and a second guide surface and a third guide surface connected to opposing ends of the first guide surface and facing each other.

7. The display apparatus of claim 6, wherein the second guide surface and the third guide surface are parallel to each other.

8. The display apparatus of claim 6, wherein the second guide surface and the third guide surface are inclined to be closer to each other as being toward the open surface.

9. The display apparatus of claim 6, wherein each of the side guide portions comprises protrusions at an end of the second guide surface adjacent to the open surface and an end of the third guide surface.

10. A display apparatus comprising:

a display module;

a plurality of moving bars disposed on a surface opposite to a display surface of the display module;

sliding portions coupled to opposing ends of the plurality of moving bars in a longitudinal direction; and side guide portions which accommodate the sliding portions and guide sliding of the sliding portions, respectively, wherein each of the sliding portions comprises a plurality of bearings spaced apart in the longitudinal direction, the plurality of bearings is in contact with a corresponding side guide portion of the side guide portions, each of the sliding portions further comprises a body portion which accommodates the plurality of bearings, and the body portion is flexibly movable within the corresponding side guide portion of the side guide portions.

11. A display apparatus comprising:

a display module;

a plurality of moving bars disposed on a surface opposite to a display surface of the display module;

sliding portions coupled to opposing ends of the plurality of moving bars in a longitudinal direction; and side guide portions which accommodate the sliding portions and guide sliding of the sliding portions, respectively, wherein each of the sliding portions comprises a plurality of bearings spaced apart in the longitudinal direction, the plurality of bearings is in contact with a corresponding side guide portion of the side guide portions, a plurality of accommodation holes is defined in each of the sliding portions, the plurality of moving bars is inserted in the plurality of accommodation holes, respectively, and the plurality of bearings and the plurality of accommodation holes are alternately arranged with each other in the longitudinal direction.

* * * * *